United States Patent [19]
Satoh et al.

[11] Patent Number: 5,543,646
[45] Date of Patent: Aug. 6, 1996

[54] FIELD EFFECT TRANSISTOR WITH A SHAPED GATE ELECTRODE

[75] Inventors: Shinichi Satoh; Hiroji Ozaki; Takahisa Eimori, all of Hyogo-ken, Japan

[73] Assignee: Mitsubishi Denki Kabushiki Kaisha, Tokyo, Japan

[21] Appl. No.: 787,912

[22] Filed: Nov. 5, 1991

Related U.S. Application Data

[63] Continuation-in-part of Ser. No. 242,116, Sep. 8, 1988, Pat. No. 5,089,863.
[51] Int. Cl.$^6$ .................... H01L 29/43; H01L 29/78
[52] U.S. Cl. .................. 257/344; 257/408; 257/409; 257/412; 257/756
[58] Field of Search ................. 357/23.3, 23.4, 357/596, 23.8; 257/412, 413, 754, 755, 756, 773, 409, 408, 335, 336, 339, 340, 344

[56] References Cited

U.S. PATENT DOCUMENTS

| | | | |
|---|---|---|---|
| 4,102,733 | 7/1978 | De La Moneda et al. | 357/59 G |
| 4,417,385 | 11/1983 | Temple | 29/571 |

(List continued on next page.)

FOREIGN PATENT DOCUMENTS

| | | | |
|---|---|---|---|
| 3709708 | 10/1987 | Germany | H01L 29/078 |
| 0083267 | 6/1980 | Japan . | |
| 0034663 | 2/1984 | Japan | 257/775 |
| 59-46084 | 3/1984 | Japan | H01S 3/18 |
| 59-115554 | 7/1984 | Japan | 437/152 |
| 60-229374 | 11/1985 | Japan | H01L 29/78 |
| 0044768 | 2/1988 | Japan | 257/756 |
| 63-44770 | 2/1988 | Japan | H01L 29/78 |
| 63-44771 | 2/1988 | Japan | H01L 29/78 |
| 0131575 | 6/1988 | Japan | 257/775 |
| 63-204772 | 8/1988 | Japan | 357/221 |
| 0281632 | 11/1990 | Japan | 357/23.3 |

| | | | |
|---|---|---|---|
| 2138632 | 10/1984 | United Kingdom | H01L 21/316 |
| 86 06877 | 11/1986 | WIPO . | |

OTHER PUBLICATIONS

Retranslation of Japan Kokai Pub. #63–44770 to Shinichi Sato et al. Feb. 25, 1988 3 pages.
Translation of Japan Kokai Pub. #63–44768 to Shinichi Sato et al. Feb. 25, 1988 15 pages.
Retranslation of Japan Kokai Pub. #63–44768 to Shinichi Sato et al. Feb. 25, 1988 3 pages.
Translation of Japan Kokai Pub. #63–44771 to Shinichi Sato et al. Feb. 25, 1988 12 pages.
Translation of Japan Kokai Publication #63–044770 to Shinichi Sato et al., Feb. 25, 1988, 15 pages.
Translation of Japan Kokai 59–0034663 (Nakao) Feb. 1984 19 pages.
Ruska, W. Scot., Chapter 6, "Etching" in Microelectronic Processing. 1987 McGraw–Hill, New York, pp. 192–237.
"Microfabrication Technique by Gas Plasma Etching Method", Hiroyoshi Komiya, et al., *Japanese J. of Applied Physics*, vol. 15 (1976), pp. 19–24.

*Primary Examiner*—William Mintel
*Assistant Examiner*—Peter Toby Brown
*Attorney, Agent, or Firm*—Lowe, Price, LeBlanc & Becker

[57] ABSTRACT

A field effect transistor comprises a semiconductor substrate having a main surface and a predetermined impurity concentration of a first conductivity type, impurity layers of a second conductivity type formed spaced apart at the main surface of the semiconductor substrate, and a shaped conductive layer serving as a gate electrode. The impurity layers constitute source-drain regions, and a region between the impurity layers defines a channel region in the main surface. The shaped conductive layer is formed on the channel region with an insulating film therebetween. The shaped conductive layer has an upper portion and a lower portion wherein the upper portion is longer than the lower portion and the length of the lower portion adjacent the insulating film is substantially equal to or shorter than the length of the channel region at the main surface. Additionally, the upper and lower portions of the shaped conductive layer are formed of the same base composition.

2 Claims, 10 Drawing Sheets

U.S. PATENT DOCUMENTS

| | | | |
|---|---|---|---|
| 4,419,809 | 12/1983 | Riseman et al. | 29/571 |
| 4,419,810 | 12/1983 | Riseman | 29/571 |
| 4,430,792 | 2/1984 | Temple | 29/571 |
| 4,476,482 | 10/1984 | Scott et al. | 357/71 |
| 4,577,391 | 3/1986 | Hsia et al. | 29/571 |
| 4,745,086 | 5/1988 | Parrillo et al. | 357/42 |
| 4,795,716 | 1/1989 | Yilmaz et al. | 437/27 |
| 4,845,046 | 7/1989 | Shimbo | 437/41 |
| 4,845,534 | 7/1989 | Fukuta | 357/15 |
| 4,907,048 | 3/1990 | Huang | 357/23.9 |
| 4,908,327 | 3/1990 | Chapman | 357/23.3 |
| 4,925,807 | 5/1990 | Yoshikawa | 357/23.3 |
| 4,933,994 | 6/1990 | Orban | 437/44 |
| 4,978,626 | 12/1990 | Poon et al. | 357/23.3 |
| 4,985,745 | 1/1991 | Kitahara et al. | 357/49 |
| 5,024,960 | 6/1991 | Haken | 437/34 |
| 5,081,052 | 1/1992 | Kobayashi et al. | 437/29 |
| 5,089,863 | 2/1992 | Satoh et al. | 357/23.3 |

FIELD EFFECT TRANSISTOR WITH A SHAPED GATE ELECTRODE

RELATED APPLICATION

The present application is a continuation-in-part of U.S. application Ser. Nos. 07/242,116 filed Sep. 8, 1988 now U.S. Pat. No. 5,089,863.

FIELD OF THE INVENTION

The present invention relates generally to a field effect transistor and, more particularly, to a field effect transistor capable of high speed operation, and to manufacturing methods therefor.

BACKGROUND OF THE INVENTION

Figure 1A:
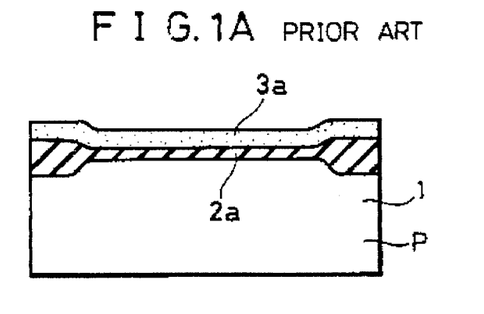
FIGS. 1A to 1D show the manufacturing method of a conventional FET in a stepwise manner.
Figure 1B:
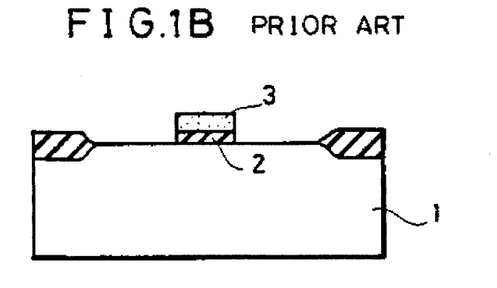
Figure 1C:
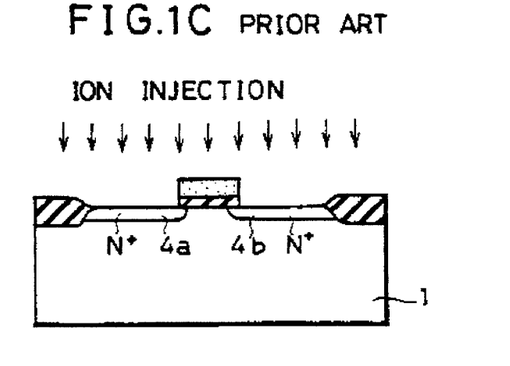
Figure 1D:
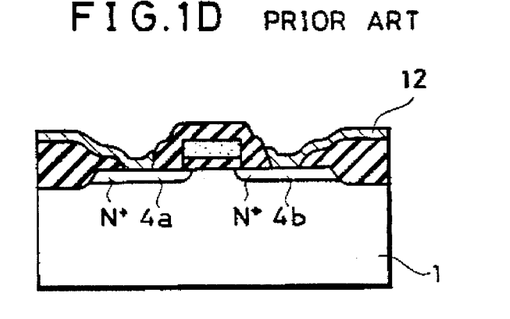
Figure 2A:
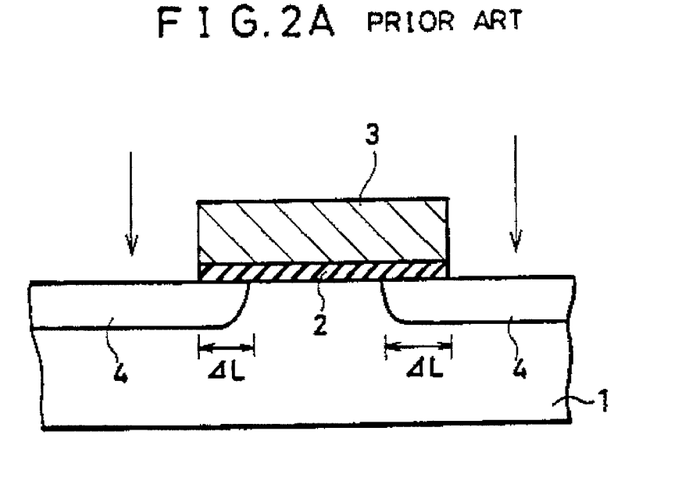
FIG. 2A is a diagram illustrating the additional capacitance existing in a conventional FET.

Field effect transistors (hereinafter referred to as FET) are well known. FIGS. 1A to 1D show a conventional manufacturing process for a conventional FET in a stepwise manner. A silicon oxide film $2a$ is formed on a P type semiconductor substrate. A layer $3a$ of silicon or a conductive material such as a metal having a high melting point is formed on the silicon oxide film. (FIG. 1A). The polysilicon layer $3a$ and the silicon oxide film 2 are simultaneously etched by a known etching method, and a gate electrode 3 and a gate insulating film 2 are formed (FIG. 1B). A known etching method is disclosed in, for example, "Microfabrication Technique by Gas Plasma Etching Method," H Komiya et al., Proc. of 7th Conference on Solid State Device 1975, Supplement to Japanese Journal of Applied Physics, Vol. 15, p.19 (1976). N type impurities are implanted from above the semiconductor substrate 1 using the gate electrode 3 as a mask. Thereafter, a heat treatment is performed. Consequently, $N^+$ impurity layers $4a$ and $4b$ are formed on a main surface of the semiconductor substrate 1 in self alignment. The $N^+$ impurity layers $4a$ and $4b$ constitute a source and a drain of a transistor ( FIG. 1C ). An Al wiring layer is formed connected to the $N^+$ impurity layers (FIG. 1D). An enlarged view of the gate portion of the FET transistor structure as described above is shown in FIG. 2A. Since the $N^+$ impurity layers $4a$ and $4b$ are formed by heat treatment, the impurities are also diffused in the transverse direction in accordance with the diffusion coefficient of the impurities. Consequently, an overlap portion is generated between the gate electrode 3 and the source-drain diffusion layers 4. The degree of overlap (the distance $\Delta L$) differs depending on the type of impurities and on the temperature of the heat treatment. An equivalent circuit of the device of FIG. 2A is shown in FIG. 2B.

Figure 2B:
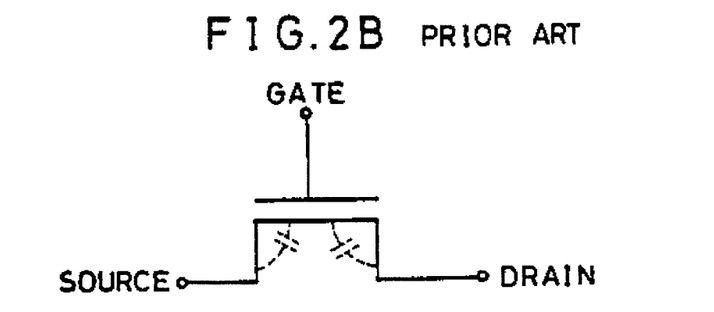
FIG. 2B is an equivalent circuit diagram of FIG. 2A.

The overlapping portion ($\Delta L$) constitutes an additional capacitance between the gate and the source-drain as shown in the equivalent circuit of FIG. 2B. Therefore, if this MOS transistor is used in an integrated circuit or the like, the MOS transistor cannot operate at a high speed and the power consumption of the MOS transistor is relatively large. If the dimension of the overlapping portion is relatively large, a so-called short channel effect will occur, thereby causing problems such as a change in the threshold voltage of the MOS transistor. Therefore, the overlapping portion is also an obstruction in reducing the size of the MOS transistor.

Figure 3:
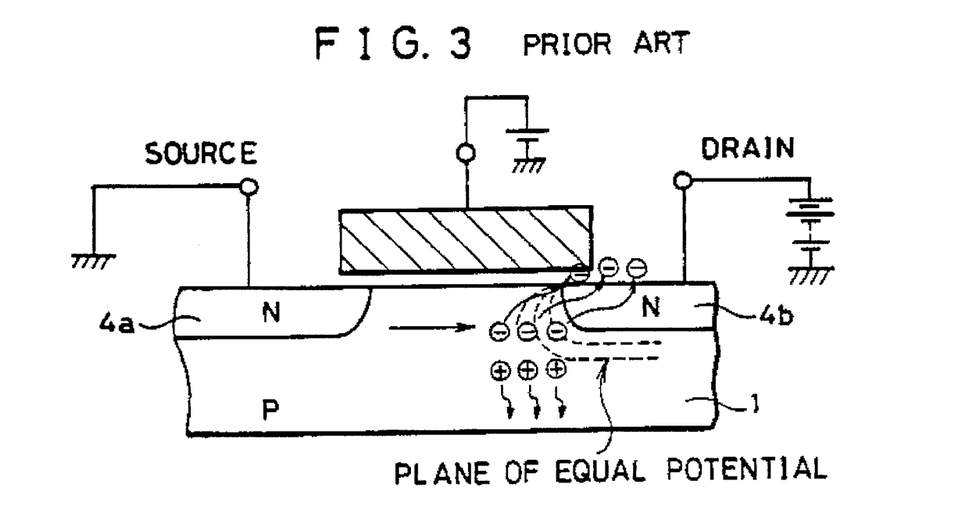
FIG. 3 illustrates hot electron effect.

In addition to the above described problem, the conventional FET also exhibits a decrease in transconductance. The transconductance is one of the characteristics of the transistor, which refers to the proportion of the drain current to the gate voltage. FIG. 3 is a schematic diagram showing the electric field and the movement of electrons in a conventional FET. The drain is maintained at a constant potential. A plane of equal potential is formed in the vicinity of the drain as shown in the figure. Therefore, an end portion of the drain has a high electric field. If a prescribed potential is applied to the gate of the transistor, a channel region is formed on the main surface of the semiconductor substrate between the source $4a$ and the drain $4b$, whereby electrons move from the source $4a$ to the drain $4b$. When the electrons reach the high electric field region near the drain, the electrons receive a large energy from the electric field, so that he electrons become hot electrons. The hot electrons generated in this manner are trapped near the gate insulating film sandwiched between the gate electrode and the drain region. Consequently, the surfaces of the drain and the channel region tend to invert to the P type. Therefore, the concentration of the N type impurities becomes substantially low and the source resistance of the MOS transistor increases. Normally, when a constant voltage. is applied to the gate electrode of the FET, a constant current flows. However, due to the above described reasons, a constant current does not flow even if a constant voltage is applied to the gate.

SUMMARY OF THE INVENTION

Accordingly, an object of the present invention is to provide a FET which is capable of high speed operation, and to provide a method for manufacturing the same.

Another object of the present invention is to provide a FET in which the transconductance is not degraded, and to provide a manufacturing method therefor.

A further object of the present invention is to provide a FET which can be highly integrated, and to provide a manufacturing method therefor.

A still further object of the present invention is to provide a FET in which any additional capacitance constituted by a gate electrode and the source-drain electrode is not generated, and to provide a manufacturing method therefor.

A still further object of the present invention is to provide a FET in which the hot electron effect described above is not generated, and to provide a manufacturing method therefor.

A still further object of the present invention is to provide a FET having a lightly doped drain (hereinafter referred to as LDD) structure in which the transconductance is not degraded, and to provide a manufacturing method therefor.

A still further object of the present invention is to provide a FET having a LDD structure and which is capable of high speed operation, and to provide a manufacturing method therefor.

The above described objects of the present invention can be attained by a FET comprising a semiconductor substrate having a main surface and a predetermined impurity concentration of a first conductivity type, an impurity layer having a second conductivity type formed spaced apart on the main surface of the semiconductor substrate, the impurity layer constituting a source-drain region, and a region sandwiched by the impurity layers defining a channel region. The FET further comprises a shaped conductive layer, the upper portion of which is longer than the lower portion thereof. The conductive layer is formed on the channel region with an insulating film interposed therebetween. The length of the lower portion of the conductive layer which is adjacent the insulating film is equal to or shorter than the length of the channel region.

Since the FET comprises a shaped conductive layer as described as the gate electrode, the dimension of the overlapping portion between the source-drain region and the gate electrode is minimized. Therefore, the capacitance constituted by the source-drain region and the gate electrode is minimized. Consequently, a FET is provided which can operate at high speed and can be highly integrated.

Additionally, since the FET comprises a shaped gate electrode as described, the electrons existing below the eaves thereof generated by the hot electron effect are neutralized. Consequently, a FET is provided in which the transconductance is not degraded.

According to a preferred embodiment of the FET of the present invention, the impurity layer comprises a first impurity layer having a first concentration and a second impurity layer having a second concentration which is higher than the first concentration; a region sandwiched by the first impurity layers constituting a first channel region, and a region sandwiched by the second impurity layers constituting a second channel region. When the FET is structured in this manner, a FET having a shaped electrode of an LDD structure is provided. Consequently, a transistor having a LDD structure which is capable of high speed operation and in which the transconductance is not degraded is provided.

According to a further embodiment of the present invention, the method of manufacturing the FET containing the first and second impurity layers comprises the following additional steps. First, insulating side walls are formed on the end surfaces of the shaped conductive layer. The length of the side wall on the main surface of the semiconductor substrate is longer than the upper portion of the conductive layer, ions of the second conductivity type are doped on the main surface of the semiconductor substrate to a second concentration which is higher than the concentration of the first impurity layer using the shaped conductive layer with the insulating side walls formed thereon as a mask. Heat treatment of the doped semiconductor substrate is then conducted.

Since the method for manufacturing the FET comprises the above described steps, a method for manufacturing the FET of the LDD structure having a shaped electrode is provided. Consequently, a method for manufacturing a transistor of the LDD structure which is capable of high speed operation and in which the transconductance is not degraded is provided.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 4A:
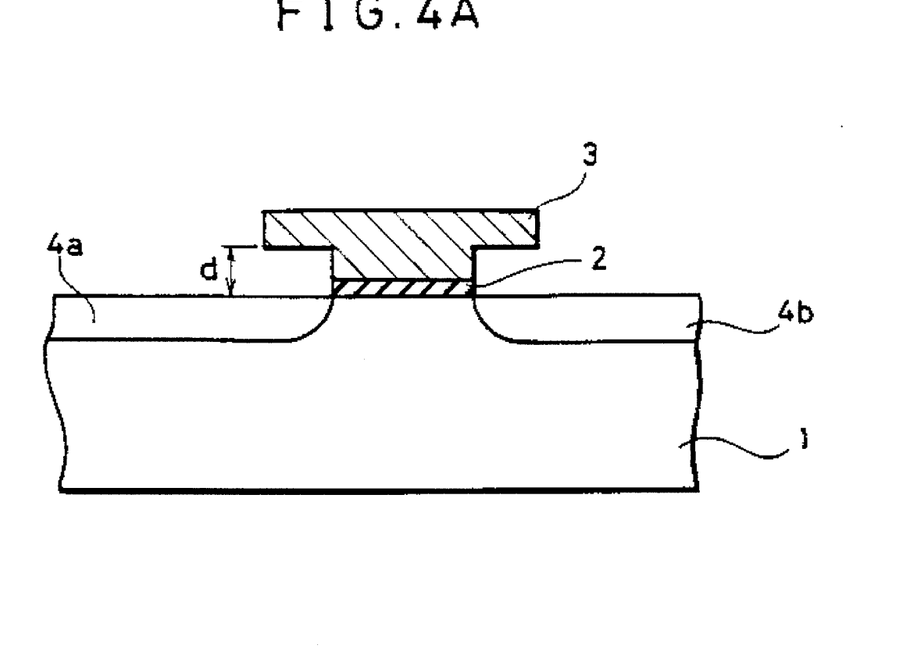
FIG. 4A shows the structure of a first embodiment of a FET in accordance with the present invention.

FIG. 4A shows a sectional structure of a FET in accordance with the present invention. Referring to FIG. 4A, the FET in accordance with the present invention comprises a semiconductor substrate 1, a source region 4a and a drain region 4b formed on the main surface of the semiconductor substrate 1, and a shaped gate electrode 3 formed on the portion of the main surface of the semiconductor substrate between source region 4a and the drain region 4b with an insulating film 2 interposed between the gate electrode and the substrate main surface.

In the embodiment of FIG. 4A, the shaped conductive layer that forms the gate electrode 3 is T-shaped and comprises an upper portion 3b and a lower portion 3a, with the upper portion 3b being longer than the lower portion 3a.

Consequently, even if the impurity regions 4a and 4b are formed in self alignment by using the gate electrode as a mask, the end portions of the impurity regions are not formed below the lower portion of the gate electrode. The distance d between the eaves of the T and the main surface of the semiconductor substrate (see FIG. 4A) is large enough not to form a capacitance. Therefore, any additional capacitance such as shown in FIG. 2B will not be generated. Consequently, a FET capable of high speed operation is provided.

Figure 4B:
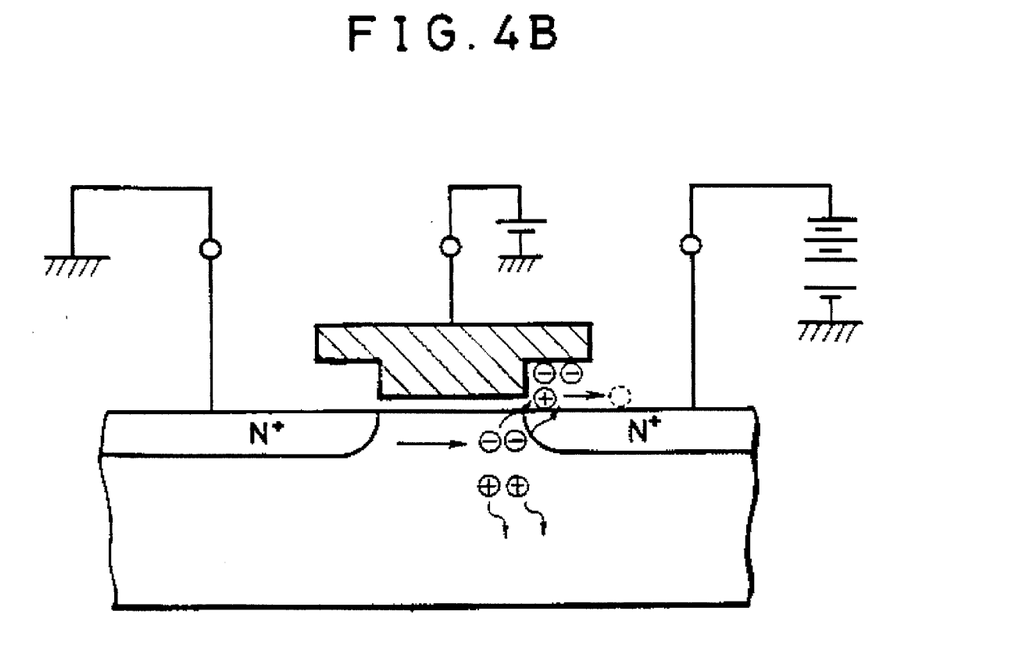
FIG. 4B illustrates the effect on the transconductance degradation of the FET of FIG. 4A in accordance with the present invention.

FIG. 4B illustrates the hot electron effect of the FET having the T-shaped gate electrode shown in FIG. 4A. Referring to FIG. 4B, the hot electrons generated by a high electric field do not degrade the transconductance in the FET having the T-shaped electrode for the following reasons. Namely, when the FET is in operation, the T-shaped gate electrode is maintained at a prescribed potential. The electrons move through the channel and turn to hot electrons by the high electric field and are trapped by the insulating film near the drain. However, since a positive potential is applied to the gate electrode as described above, the surface of the insulating film below the eaves of the T-shaped gate electrode has a positive potential. Therefore, the trapped hot electrons are neutralized and the surfaces of the drain and the channel regions are not inverted to the P type. If a constant voltage is applied to the gate electrode, a prescribed current flows. Consequently, a FET is provided in which the transconductance is not degraded.

Figure 4C:
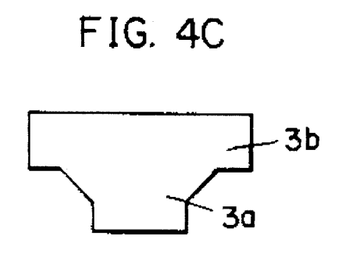
FIGS. 4C to 4F show the structures of additional embodiments of the gate structure in accordance with the present invention.
Figure 4D:
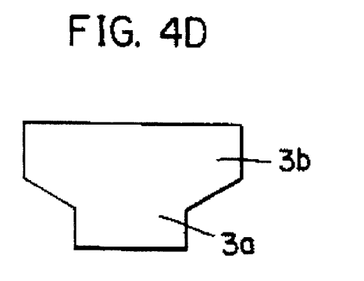
Figure 4E:
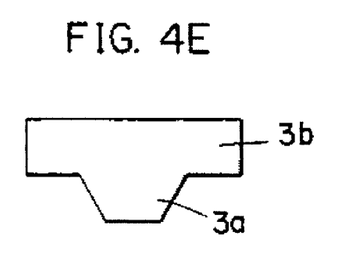
Figure 4F:
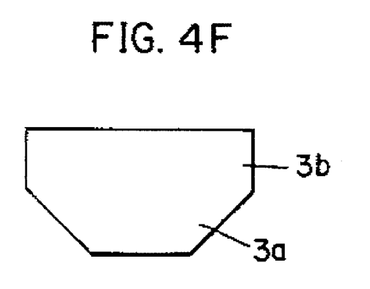

FIGS. 4C–4F show additional embodiments of the FET according to the present invention containing a shaped conductive layer as a gate electrode. In all of the embodiments of FIGS. 4C–4F, the shaped conductive layer has an upper portion and a lower portion wherein the upper portion is longer than the lower portion and the length of the lower portion adjacent the insulating film is substantially equal to or shorter than the length of the channel region at the main surface of the semiconductor substrate. In the embodiments of FIGS. 4C and 4D, the lower portion 3a includes a section having tapered sidewalls and a section having vertical sidewalls. In the embodiments of FIGS. 4E and 4F, the sidewalls of the lower portion are tapered along their entire length. As in the embodiment set forth in FIG. 4A, even if the impurity regions 4a and 4b of the FET's of FIGS. 4C–4F are formed in self alignment by using the gate electrode as a mask, the end portions of the impurity regions are not formed below the lower portion of the gate electrode. The distance d between the eaves of the upper portion of the gate electrode and the main surface of the semiconductor substrate in each of the FET's of FIGS. 4C–4F is sufficiently large not to form a capacitance. Therefore, any additional capacitance such as shown in FIG. 2B will not be generated and FET's capable of high speed operation are provided.

Figure 5A:
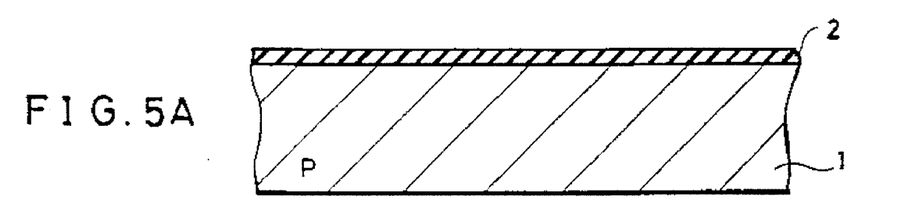
FIGS. 5A to 5F show in a stepwise manner a first method for manufacturing a FET in accordance with the present invention.
Figure 5B:
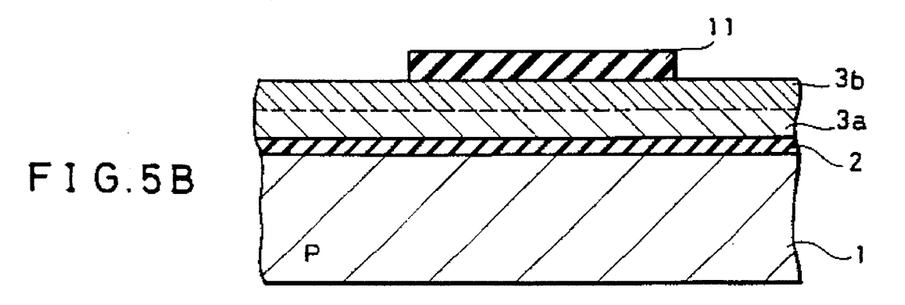
Figure 5C:
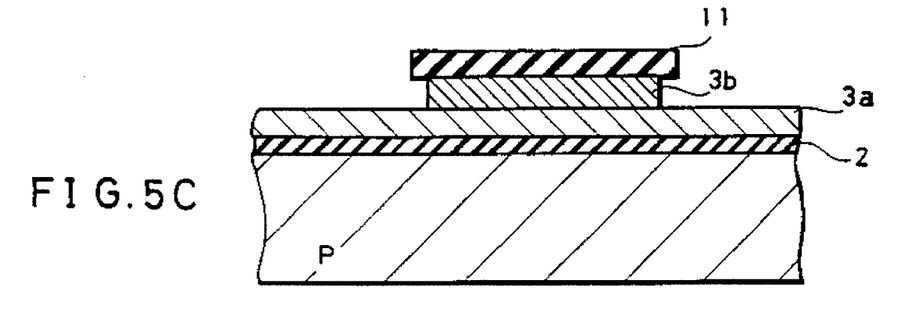
Figure 5D:
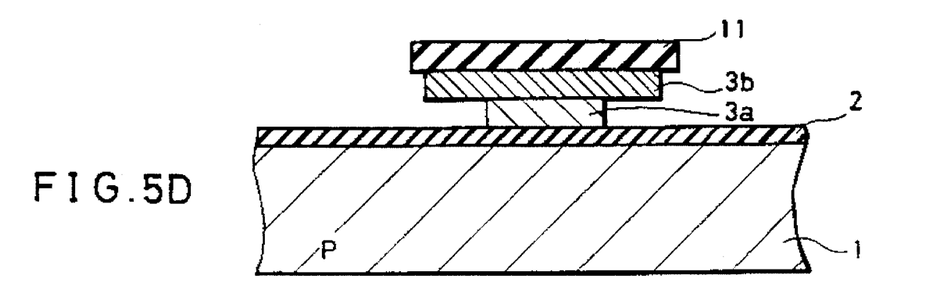

FIGS. 5A to 5F show in a stepwise manner a first method for manufacturing a FET having the shaped gate electrode in accordance with the present invention. A P type semiconductor substrate 1 is prepared. A silicon oxide film 2 is formed on the main surface thereof (FIG. 5A). A lower layer 3a is formed on the silicon oxide film 2 and an upper layer 3b is formed thereon. A resist 11 is placed on a prescribed position on the upper layer 3b (FIG. 5B). The lower layer 3a and the upper layer 3b are etched by a known plasma etching method (FIG. 5C). The speed of etching of the lower layer 3a and the upper layer 3b are different from each other even under the same etching conditions. That is, the etching speed of the lower layer 3a is faster than that of the upper layer 3b. Consequently, the amount of etching of the lower layer 3a in the transverse direction is greater than the amount of etching of the upper layer 3b (FIG. 5D). Consequently, after a prescribed time period, a shaped gate electrode such as shown in FIG. 5D is formed.

More particularly, the lower layer 3a and the upper layer 3b are preferably formed of the same base composition, i.e., polysilicon. However, in this embodiment, it is preferred that these layers contain a differing chemical or physical feature which provides the lower layer with a faster etch rate as compared with the upper layer etch rate. For example, the lower and upper layers may be formed of polysilicon wherein the grain size of the polysilicon in the upper layer is different from that of the lower layer. With reference to FIG. 5B, the upper layer 3b may be formed of polysilicon having a 0.5 μ grain size. Such a polysilicon layer may be formed by chemical vapor deposition at a temperature of about 650° C. to 700° C. On the other hand, the lower layer 3a may be formed of polysilicon having a grain size of from 1 to 2μ. Such a polysilicon layer may be formed by chemical vapor deposition at a temperature of about 580° C. to 600° C. The following etching conditions have then been employed to polysilicon layers 3a and 3b having differing grain sizes as described above:

(i) Reaction gas: $Cl_2$ and $O_2$ (5%)
(ii) Flow rate: 70 sccm (70 cc per minute; sccm is standard cubic per cm)
(iii) Pressure: 150 mTorr
(iv) Power: 0.2 Watt/$cm^2$
(v) Plate temperature: 20° C.
(vi) Electrode type: parallel plate type RIE (Cathode Coupling Type wherein RF is applied to the lower electrode on the wafer side)

As a result, upper layer 3b formed of the polysilicon having the smaller grain size had an etch rate of about 1500 Å/min while the lower layer 3a formed of polysilicon having the larger grain size had an etch rate of about 2500 Å/min, i.e., approximately 1.7 times faster than that of the upper layer, thereby resulting in the formation of a shaped conductive layer gate electrode having an upper portion and lower portion with the upper portion being longer than the lower portion.

Similarly, the lower layer 3a may be provided with a faster etch rate than upper layer 3b by providing the upper layer with a first ion impurity concentration and the lower layer with a second ion impurity concentration wherein the second ion impurity concentration is greater than the first ion impurity concentration. For example, if the upper layer is provided with a phosphorous ion impurity concentration of about $1 \times 10^{15}/cm^3$ and the lower layer is provided with a phosphorous ion impurity concentration of about $1 \times 10^{19}/cm^3$ the lower layer will have an etch rate which is approximately twice as fast (about 3,000 Å/min as compared with about 1500 Å/min) as compared with the upper layer. In a further embodiment, the upper and lower layers may be provided with different ion impurities wherein the ion impurities are selected so that the lower layer has a faster etch rate as compared with the upper layer. For example, if the lower layer is provided with a phosphorous ion impurity concentration of $1 \times 10^{15}/cm^3$ it would have an etch rate of about 1500 Å/min while if the upper layer were provided with an arsenic ion impurity concentration of $1 \times 10^{15}/cm^3$ it would have an etch rate of about 1200 Å/min.

Thus, in this first embodiment of making a field effect transistor having a shaped conductive layer according to the present invention, the upper and lower portions of the shaped conductive layer are formed of the same base composition, for example, polysilicon or a metal having a high melting point such as molybdenum silicon. However, the upper and lower layers from which the upper and lower portions of the shaped conductive layer are formed have a differing chemical or physical characteristic which provides the lower layer with a faster etch rate as compared with the upper layer so that the shaped conductive layer having an upper portion which is longer than the lower portion is formed in a single etching step.

In a further embodiment of forming the shaped conductive layer from upper and lower layers having the same base composition, the lower layer is provided with a crystal defect which causes the etch rate of the lower layer to be faster as compared with that of the upper layer. For example, the lower layer may be provided with a crystal defect by implanting $Ar^+$ as a neutral atom at a concentration of about $1 \times 10^{16}/cm^3$. As is well known in the art, the depth of the crystal defect can be controlled by selection of the implant energy in accordance with the thickness of the upper layer. The resulting etching rate of a lower polysilicon layer containing such a crystal defect is about 1650 Å/min, which is about 10% faster than a similar polysilicon layer which does not contain the crystal defect provided by the $Ar^+$ implantation.

Preferable conditions for etching in the method illustrated in FIG. 5 are, for example, as follows:

gas composition: carbon fluoride $CF_4$ (99%) and oxygen $O_2$ (1%)

power: radio frequency 20–200 W gas pressure: 0.3–0.7 Torr

Figure 5E:
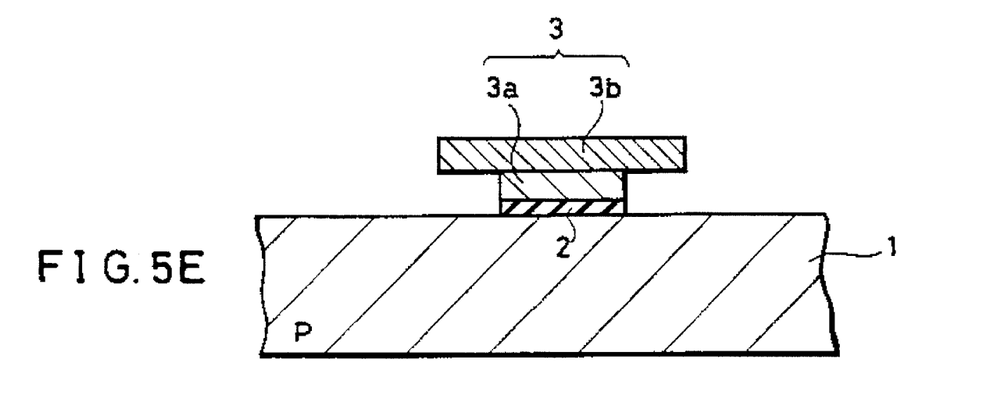
Figure 5F:
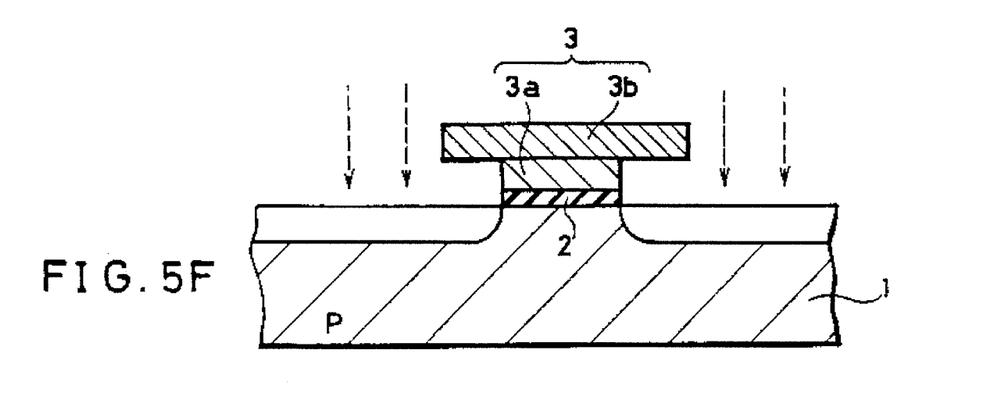

After formation of the gate electrode, the silicon oxide film 2 is removed, except for the portion below the gate electrode (FIG. 5E). After N type impurities are doped from above the substrate using the shaped gate electrode as a mask, the substrate is subjected to heat treatment at a high temperature. Consequently, impurity diffused layers 4a and 4b which are to be the source-drain, respectively, are formed on the main surface of the substrate (FIG. 5F). The gate electrode is shaped so that its upper portion is longer than its lower portion, and the lower portion which is adjacent the insulating film is substantially equal to or shorter than the length of the channel region at the main surface of the substrate. Therefore, an N type impurity region is not formed below the shaped gate electrode. Consequently, a method for manufacturing a FET is provided in which no additional capacitance is generated.

Figure 6A:
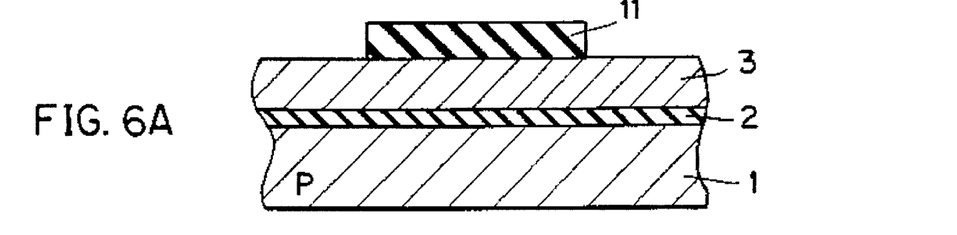
FIGS. 6A to 6D show a second method of forming the shaped conductive layer of the FET of the present invention.
Figure 6B:
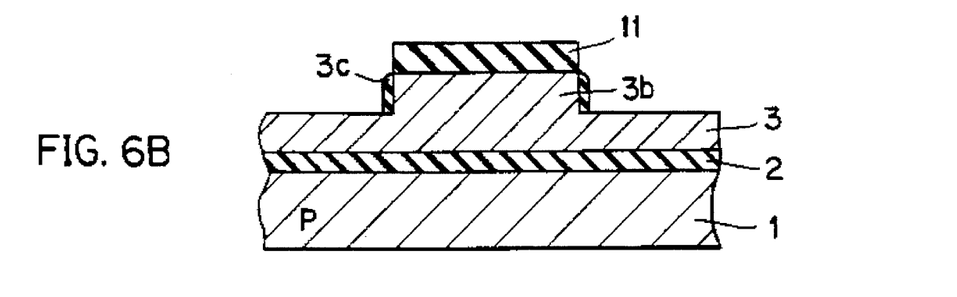

In a second manufacturing embodiment, the shaped conductive layer of the FET of the present invention may be produced from a single layer of material with the upper and lower portions of the shaped conductive layer being formed by two or more different etching steps which employ different etching conditions. This method is illustrated in FIGS. 6A–6D. With reference to FIG. 6A, the P type substrate 1 is provided with a silicon dioxide insulating layer 2 and a layer 3 from which the conductive layer is formed is provided on the silicon dioxide layer 2. A resist 11 is placed on a prescribed position of the layer 3. A first etching step employing normal etching conditions as described above is then conducted for a limited amount of time. This results in formation of the upper portion 3b of the shaped conductive layer serving as the gate electrode. Under normal etching conditions as described above, the selection ratio between the resist mask and the etchant is about 1, and an organic polymer from the resist material adheres on the sidewalls of the etched layer during the etching. This is illustrated by reference numeral 3c in FIG. 6B. Since this adhesion layer 3c acts as a protection layer, etching of the portion 3b in the side or transverse direction is inhibited.

Figure 6C:
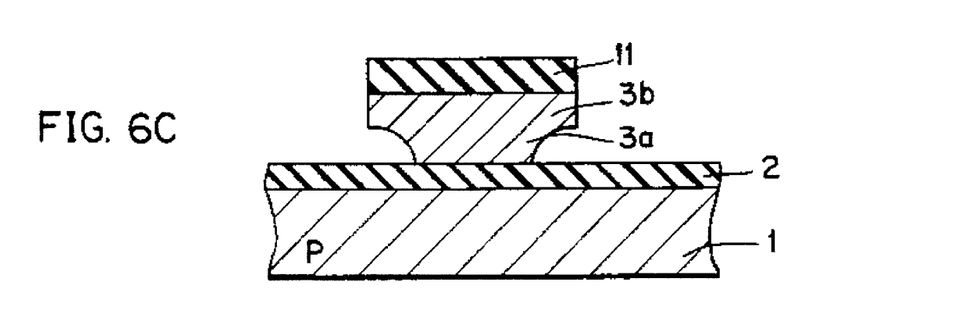

After completion of the first etch step, one or more additional etch steps are conducted in an isotropic manner whereby side etching or etching in the transverse direction takes place, resulting in the formation of the lower portion 3a of the shaped conductive layer. Suitable etching conditions for the second etch step are as follows:

(i) Reaction gas: $SF_6$ (100%)

(ii) Flow rate: 120 sccm (iii) Pressure: 800 mTorr (iv) Power: 0.15 watt.cm$^2$ (v) Electrode type: parallel plate type RIE (anode coupling type wherein RF is applied to the upper opposite electrode).

If a polysilicon layer 3 is etched at a rate of about 2,000 Å/min under the normal etching conditions described above as the first etching step, and the new etching conditions as described above are employed in a second etching step, the shaped conductive layer gate electrode as shown in FIG. 6C is obtained since the lower portion of the polysilicon layer 3 is side etched in the isotropic second etching step.

Figure 6D:
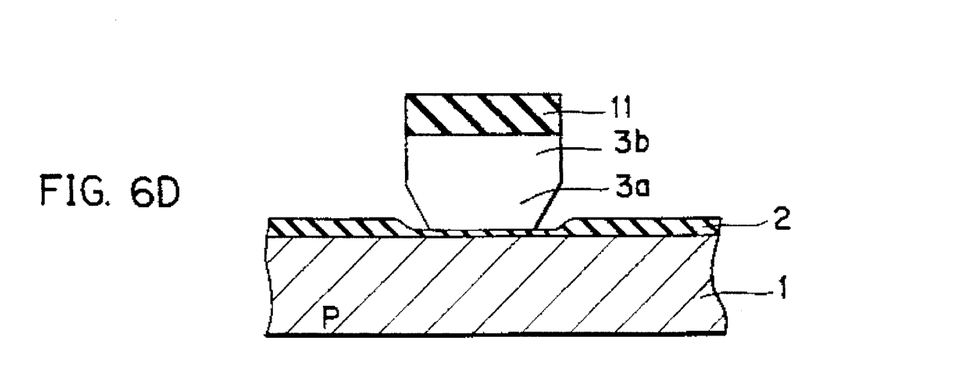

Additionally, in the isotropic etching step as described above, when silicon dioxide is used as the insulating film under a polysilicon layer, a phenomenon occurs wherein the polysilicon near the interface of the polysilicon layer 3 and the silicon dioxide insulating layer 2 is excessively etched due to the reflection of the reactive ion, i.e., fluorine radicals, from the silicon dioxide insulating film during the final etching stage. Additionally, the effect of this excessive etching is increased when the silicon dioxide insulating film is inclined as shown in FIG. 6D. Thus, the use of an inclined silicon dioxide insulating film as shown in FIG. 6D is advantageous when a wedge-shaped lower portion in the shaped conductive layer is desired.

Thus, it would be apparent to one of ordinary skill in the art that the base composition of the upper and lower layers which form the conductive layer and/or the etching conditions employed to form the shaped conductive layer may be varied in order to provide various shaped conductive layers wherein the upper portion of the shaped conductive layer is longer than the lower portion of the shaped conductive layer and the lower portion adjacent the insulating film is substantially equal to or shorter than the length of the channel region at the main surface in order to provide an improved FET according to the present invention.

Figure 7A:
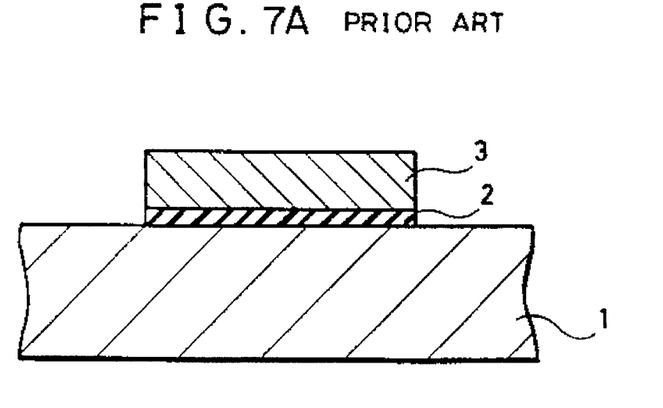
FIGS. 7A–7C show in a stepwise manner a method for manufacturing a conventional FET having a LDD structure.
Figure 7B:
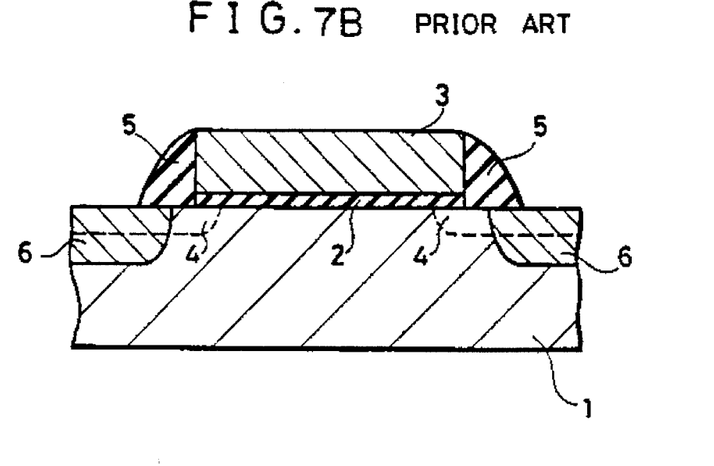
Figure 7C:
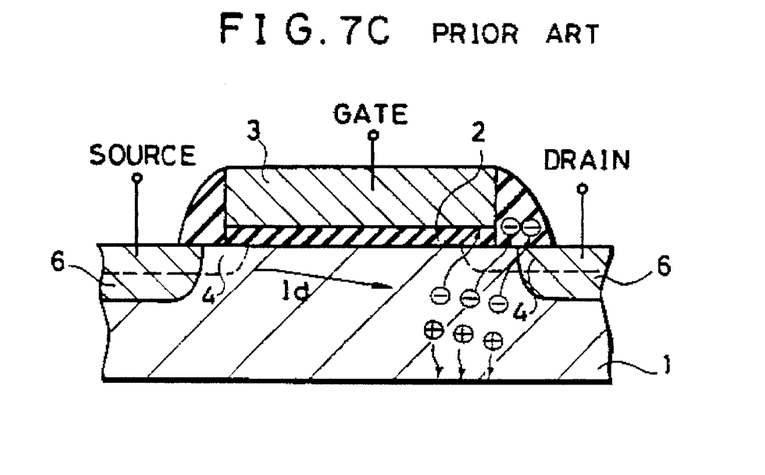

The FET of the invention having a shaped gate electrode is applied to a transistor of a LDD structure. A conventional transistor of a LDD structure is shown in FIG. 7C. Referring to FIG. 7C, the conventional transistor having a LDD structure comprises a P type semiconductor substrate 1, a gate electrode 3 formed on the main surface of the semiconductor substrate 1 with an insulating film interposed therebetween, an N type impurity diffused layer 4 of low concentration formed on the main surface of the semiconductor substrate, an N type impurity diffused layer 6 of high concentration, respectively, and side walls 5 formed on both sides of the gate electrode. Since the transistor having the LDD structure has two impurity layers of low concentration and high concentration, the high electric field near the drain is weakened. Consequently, the hot electron effect is suppressed. However, as in a common FET, the FET having the LDD structure has the problems of additional capacitance, the degradation of transconductance, and the The method for manufacturing a conventional FET having the LDD structure is shown in FIGS. 7A to 7C. A gate electrode 3 is formed on a P type semiconductor substrate with an insulating film 2 interposed therebetween. The gate electrode is formed by processing conductive materials such as polycrystalline silicon or a metal having a high melting point using a known method, for example, utilizing plasma reactance (FIG. 7A).

Impurities of a second conductivity type are ion implanted on the main surface of the substrate 1 to a concentration of about $1 \times 10^{12}$/cm$^2$ to $1 \times 10^{14}$/cm$^2$. On this occasion, N$^-$ diffusion layers 4 are formed on both sides of the gate electrode 3 in self alignment using the gate electrode 3 as a mask.

An oxide film such as a silicon oxide film is formed on the main surface of the semiconductor substrate 1 and on the gate electrode 3 to a prescribed thickness. The oxide film is etched by an anisotropic etching method such as ion etching having directivity. Consequently, silicon oxide films in the form of side walls 5 are formed on the side walls of the gate electrode 3. Impurities having the second conductivity type opposite to that of the substrate 1 are then ion implanted to a high concentration (no less than $1 \times 10^{14}$/cm$^2$) using the side walls 5 and the gate electrode 3 as masks, and heat treatment is carried out at a high temperature. Consequently, activated source-drain diffused layers 6 are formed (FIG. 7C). The high concentration source-drain diffused layers 6 are formed in self alignment by using the side walls 5 as masks, so that the layers are formed towards the outer portions of the impurity diffused layers of low concentration.

A conventional FET having the LDD structure is manufactured in the above described manner. Therefore, the conventional method comprises problems such as an increase in the steps for forming the side walls, and the difficulty in controlling the width of the side walls.

Figure 8A:
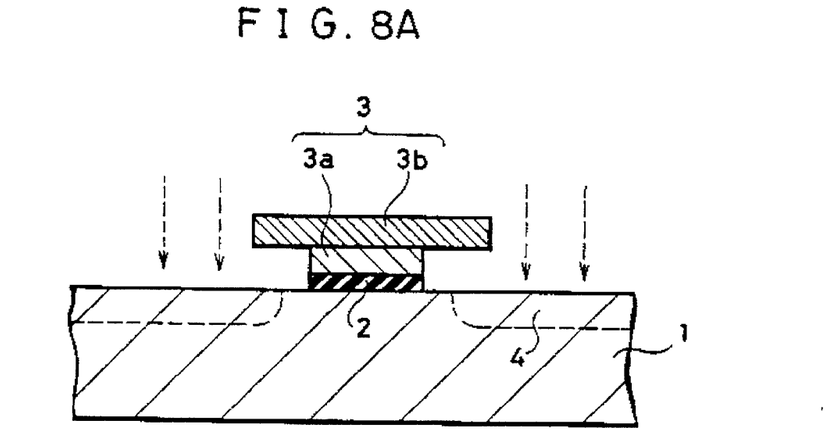
FIGS. 8A to 8C show in a stepwise manner a method for manufacturing a FET having a LDD structure in accordance with the present invention.
Figure 8B:
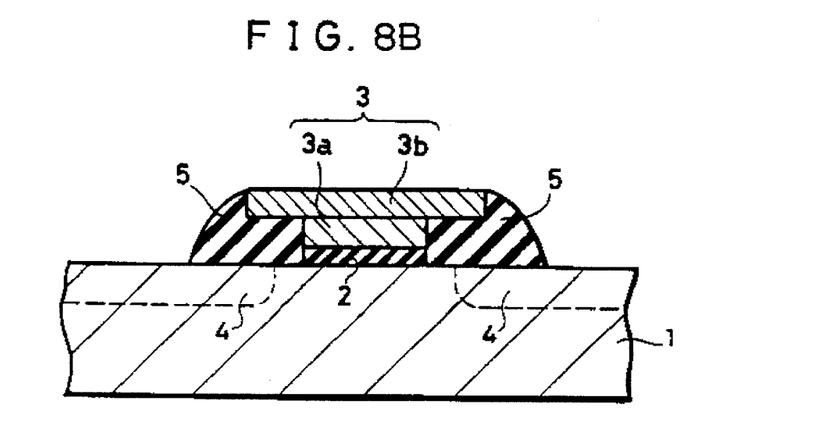
Figure 8C:
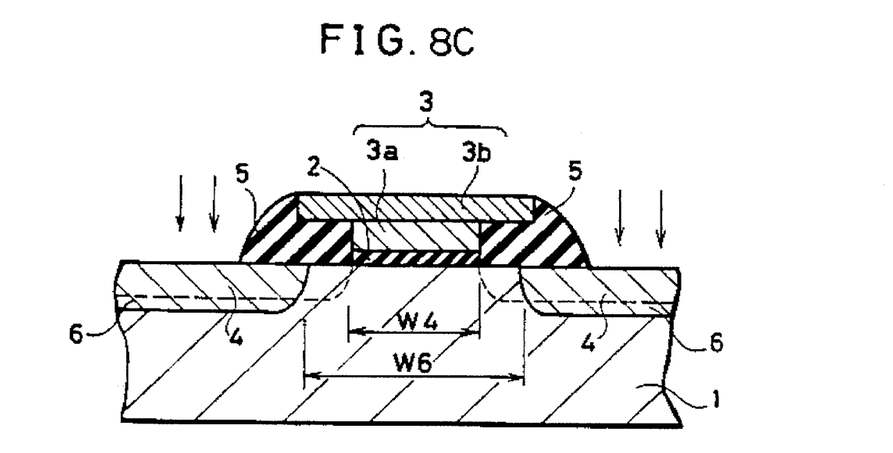

A method for manufacturing a FET having the LDD structure utilizing the FET having a shaped gate electrode in accordance with the present invention is shown in FIGS. 8A to 8C. The process steps up to formation of the shaped gate electrode on the semiconductor substrate 1 with an insulating film interposed therebetween are the same as those shown in FIGS. 5A to 5E, or FIGS. 6A–6D, depending on the method of formation of the shaped gate electrode. The gate electrode 3 includes the lower portion 3a and the upper portion 3b as shown in FIG. 8A.

Impurities having the second conductivity type, opposite to that of the substrate 1, are then ion implanted to a low concentration ($1\times10^{12}$/cm$^2$ to $1\times10^{14}$/cm$^2$) from above the substrate by a known ion implantation technique using the gate electrode 3 as a mask. The substrate 1 is heat treated and low concentration source-drain diffused layers 4 are formed with the end portions thereof approaching the ends of the lower portion of the gate electrode 3 on the side of the substrate (FIG. 8A).

Thereafter, an insulating film such as a silicon oxide film is formed on the main surface of the substrate 1, and on the gate electrode 3 to a prescribed thickness. An anisotropic etching method such as ion etching having directivity is carried out on the entire surface to form silicon oxide film side walls 5 on the side walls of the gate electrode 3 (FIG. 8B).

Thereafter, impurities having the second conductivity type, opposite to that of the substrate 1, are ion implanted to a high concentration (more than $5\times10^{14}$/cm$^2$) on the entire surface using the gate electrode 3 and the side walls 5 as masks. By the heat treatment of the substrate, high concentration source-drain diffused layers 6 are formed (FIG. 8C). On this occasion, the high concentration source-drain diffused layers 6 are formed continuous to the low concentration source-drain diffused layers 4. The distance W4 between ends of the low concentration source-drain diffused layers 4 is narrower than the distance W6 between ends of the high concentration source-drain diffused layers 6. Consequently, a double diffusion structure is provided.

The FET manufactured by the above described method comprises source-drain diffused layers of double diffusion structure consisting of low concentration diffused layers and high concentration diffused layers. Consequently, the electric field is weakened near the drain, whereby the generation of hot carriers can be suppressed. Even if the generated hot carriers are trapped in the insulating film 5, the negative potential of the electrons in the insulating film can be neutralized as described above, and consequently, the problem of degradation of transconductance due to the high resistance of the low concentration impurity layer 4 is prevented. Since the end of the above described low concentration impurity layer 4 is approximately aligned with the end of the lower portion of the gate electrode 3, any additional capacitance is hardly generated.

The present invention can be applied to the N type or P type MOS transistors, and it can be applied to MOS transistors formed not only on the single substrate but on an epitaxial substrate or on a wafer. In either case, the same effect as described in the above embodiment can be obtained. The present invention is also applied to a compound semiconductor other than the silicon semiconductor.

Figure 9:
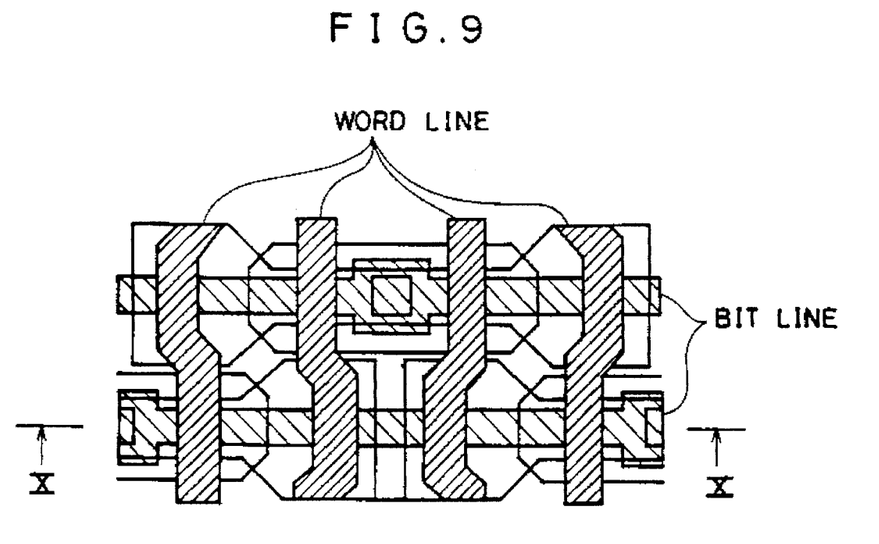
FIG. 9 is a plan view of a semiconductor memory device to which a FET of the present invention is applied.
Figure 10:
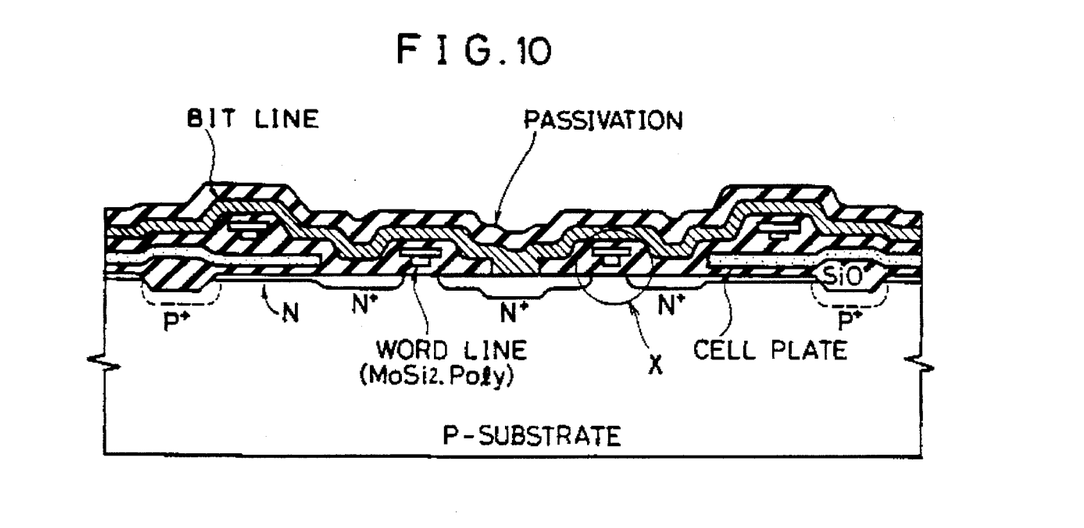
FIG. 10 is a cross sectional view taken along the line IX—IX of FIG. 9.
Figure 11:
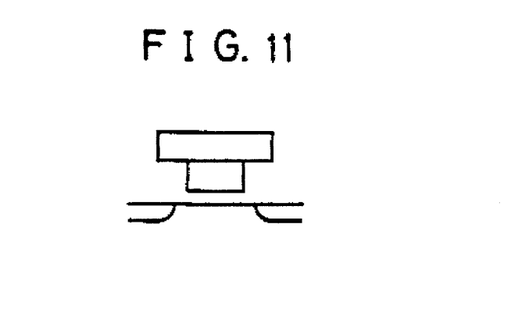
FIG. 11 is a partial enlarged view of FIG. 10.

A semiconductor memory device to which the FET in accordance with the present invention is applied will be explained. FIG. 9 is a plan view of a semiconductor memory device to which the FET of the present invention is applied. FIG. 10 is a cross sectional view taken along the line of FIG. 9. FIG. 11 is a partial enlarged view of the part designated by an arrow X in FIG. 10.

Referring to FIGS. 9 to 11, the FET of the present invention can be easily incorporated with a semiconductor memory device. Accordingly, a semiconductor memory device whose operation speed is high can be easily provided.

In the FET in accordance with the present invention, the length of the channel region is substantially equal to the length of the lower portion the shaped gate electrode formed thereon, so that there is no overlapping portion between the lower portion of the gate electrode and the source-drain regions. Therefore, there will be no additional capacitance, and the speed of operation is increased. The potential in the upper layer portion of the shaped gate electrode neutralizes the electrons trapped therebelow, whereby the transconductance is not degraded.

In accordance with the methods for manufacturing the FET of the present invention, the shaped gate electrode comprises upper and lower portions, each of which is formed of the same base composition, and the gate electrode can be formed in one step of anisotropic etching as shown in FIG. 5D or in two or more etching steps, including an isotropic etching step, as shown in FIGS. 6A–6D. Therefore, the manufacturing can be carried out easily.

As described above, the FET in accordance with the present invention comprises a T-shaped gate electrode consisting of upper and lower portions and source-drain regions having a channel region whose length is equal to or longer than the length of the lower portion of the shaped gate electrode. Consequently, a FET can be provided which is capable of high speed operation, in which the transconductance is not degraded and which can be manufactured easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor comprising:

a semiconductor substrate having a main surface and a predetermined impurity concentration of a first conductivity type;

impurity layers of a second conductivity type formed spaced apart at the main surface of the semiconductor substrate, said impurity layers constituting source-drain regions, and a region between said impurity layers defining a first channel region at said main surface; and a shaped conductive layer formed on said first channel region with an insulating film interposed therebetween at said main surface, said shaped conductive layer having an upper portion and a lower portion, the upper portion being longer than the lower portion, the length of the lower portion adjacent the insulating film being substantially equal to or shorter than the length of said first channel region, and the upper and lower portions being formed of polysilicon, the lower portion of polysilicon of said shaped conductive layer containing a crystal defect which causes the etch rate of the lower portion to be faster as compared with an etch rate of the upper portion under the same etching conditions.

2. A field effect transistor comprising:

a semiconductor substrate having a main surface and a predetermined impurity concentration of a first conductivity type;

impurity layers of a second conductivity type formed spaced apart at the main surface of the semiconductor substrate, said impurity layers constituting source-drain regions, and a region between said impurity layers defining a first channel region at said main surface, each of said impurity layers comprising a first impurity layer portion having a first impurity concentration and a second impurity layer portion having a second impurity concentration which is higher than the first impurity concentration, said first channel region being defined by a first distance between said first impurity layer portions and a second channel region being defined by a second distance between said second impurity layer portions; and a shaped conductive layer formed on said first channel region with an insulating film interposed therebetween at said main surface, said shaped conductive layer having an upper portion and a lower portion, the upper portion being longer than the lower portion, the length of the lower portion adjacent the insulating film being substantially equal to or shorter than the length of said first channel region, and the upper and lower portions being formed of polysilicon, the lower portion polysilicon of said shaped conductive layer containing a crystal defect which causes the etch rate of the lower portion to be faster as compared with an etch rate of the upper portion under the same etching conditions.

* * * * *